Figure 1:
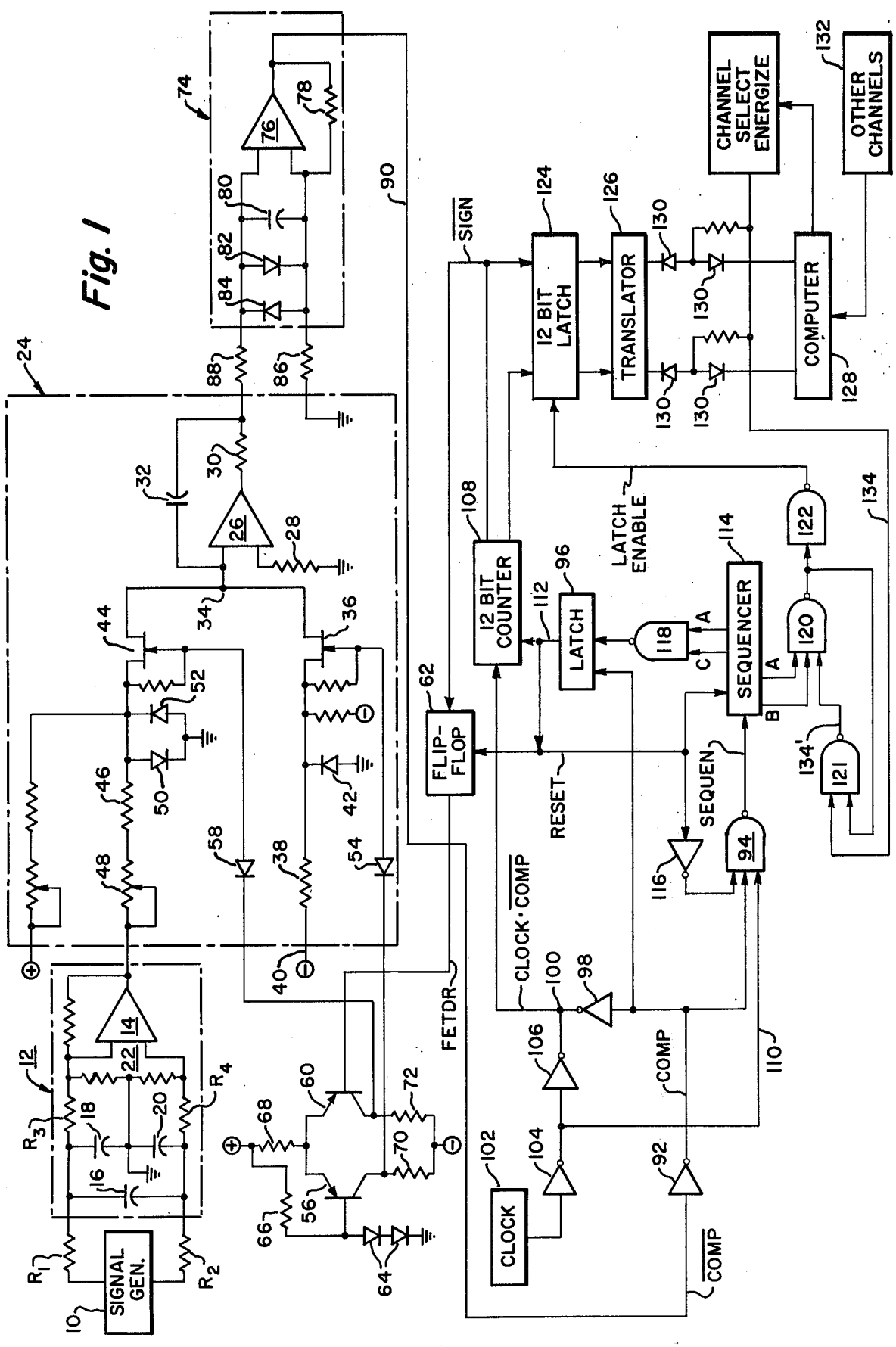

United States Patent [19]

Zitelli et al.

[11] 4,117,477
[45] Sep. 26, 1978

[54] SINGLE-POINT ANALOG SUBSYSTEM INTERFACED WITH A COMPUTER

[75] Inventors: William E. Zitelli, Media; Andras I. Szabo, Export, both of Pa.

[73] Assignee: Westinghouse Electric Corp., Pittsburgh, Pa.

[21] Appl. No.: 833,550

[22] Filed: Sep. 15, 1977

Related U.S. Application Data

[63] Continuation of Ser. No. 689,626, May 24, 1976, abandoned, which is a continuation of Ser. No. 529,200, Dec. 3, 1974, abandoned, which is a continuation of Ser. No. 362,990, May 22, 1973, abandoned.

[51] Int. Cl.² .............................................. H03K 13/20
[52] U.S. Cl. ............................................. 340/347 NT
[58] Field of Search .................. 340/347 NT; 364/200

[56] References Cited

U.S. PATENT DOCUMENTS 3,701,146 10/1972 Haga .............................. 340/347 NT
3,709,309 1/1973 Williams ...................... 340/347 NT Primary Examiner—Charles D. Miller
Attorney, Agent, or Firm—C. M. Lorin

[57] ABSTRACT

A low-cost, single-point analog subsystem comprising a pre-amplifier signal conditioner, a dual-slope integration analog-to-digital converter, and a computer interface circuit. The unit is capable of rejecting high common mode voltages while maintaining extremely high system accuracies. The main application for the invention is in interfacing transducer or instrumentation analog data with a digital computer. The interface circuitry allows the computer to select its channel in an asynchronous manner through special controllogic and without the necessity for employing conventional multiplexing equipment.

1 Claim, 3 Drawing Figures

SINGLE-POINT ANALOG SUBSYSTEM INTERFACED WITH A COMPUTER

This is a continuation of application Ser. No. 689,626, filed May 24, 1976, now abandoned, which is a continuation of application Ser. No. 529,200, filed Dec. 3, 1974, now abandoned, which is a continuation of application Ser. No. 362,990, filed May 22, 1973, now abandoned.

BACKGROUND OF THE INVENTION

As is known, the digital computer has become the most economic and efficient piece of equipment in the processing and instrumentation fields. However, its adaptation to analog input signals has presented many problems. Rejection of common mode and normal mode noise brought about by industrial environments and system imbalance is of major importance to the computer interface. Additionally, converting the analog transducer signal to a digital code within system accuracy is of equal importance.

High voltage common mode noise can destroy or damage much of the costly precision instrumentation at the computer interface if not rejected. Furthermore, this same noise will create normal mode noise due to system inaccuracies (i.e., imbalance of transducer impedance, improper cabling and terminations and the like). The normal mode noise can yield misleading output information. In control systems where a monotonically increasing or decreasing signal is demanded, an erroneous signal due to persistent noise can prove disastrous.

Prior art protection systems for computer interfaces against common mode noise comes from a fully-guarded floating metal enclosure which completely surrounds the precision instrumentation. The transducer analog signal is presented to the interface through a twisted-shielded cable and is usually connected to the bus by a three-pole electromechanical relay. The shield is connected to the metal enclosure. Due to capacitive coupling to system ground and leakage caused by slight conductance of insulation, currents will be allowed to flow in the shield. This will induce normal mode noise into the signal input. To eliminate this noise, the input signal is usually amplified and converted to a rate signal which is coupled to another system which integrates the signal over one period of line frequency. Phase locking onto line frequency is the method used for determining the precise period of integration.

Such prior art systems employ complex electronic circuitry to meet their high standards. Multiplexing of the analog inputs has become mandatory to reduce costs per analog input signal. It can be readily seen that as the number of analog signals with which the computer must interface is reduced to a small number, the economics of the system becomes the dominant factor.

SUMMARY OF THE INVENTION

In accordance with the present invention, a low-cost, single-point analog-to-digital converter and computer interface are provided which can be fabricated as a completely self-contained module characterized by high voltage noise rejection and protection and analog-to-digital conversion with high accuracy. The invention can be economically utilized where industrial process control demands monitoring of only a few transducer points since no expensive multiplexing equipment is required. In this respect, a system channel (i.e., one analog input) may be selected in an asynchronous manner by the computer; the system is independent of time and temperature related drift errors; and the hardware associated with forcing an integrator back to its initial condition or starting point is eliminated.

Specifically, there is provided apparatus for converting an analog signal to a digital signal and for applying the resulting digital signal through an interface to a digital computer, which apparatus includes capacitor means for periodically integrating the analog signal from a threshold voltage over a fixed period of time, and means for discharging the capacitor means back to the threshold voltage over a period of time dependent upon the magnitude of the charge built up on the capacitor means during charging. Counter means is coupled to the discharging means for providing a digital signal representative of the time of discharge back to the threshold voltage; while latching means are provided for receiving and storing the digital signal representative of the time of discharge and, hence, the magnitude of the analog signal.

In order to enable transfer of the representative digital signal from the counter means to the latching means, a sequencer is provided which is operable only after discharge of the capacitor means back to the threshold voltage and before the next periodic integrating period begins. In this respect, the sequencer acts to trigger transfer of the counter of the counter means to the latching means in a dwell period between succeeding charging and discharging cycles. Additionally, the sequencer acts to reset the counter and load the memory means for a succeeding cycle of operation. However, if the computer signals that it is ready to receive information at the end of a counting period, the latching means is disabled; no information is transferred to the memory means; and information is fed into the computer during this period. In this latter case, the cycle repeats again; but information is transferred to the computer during this cycle only if the computer continues to request information.

Figure 2A:
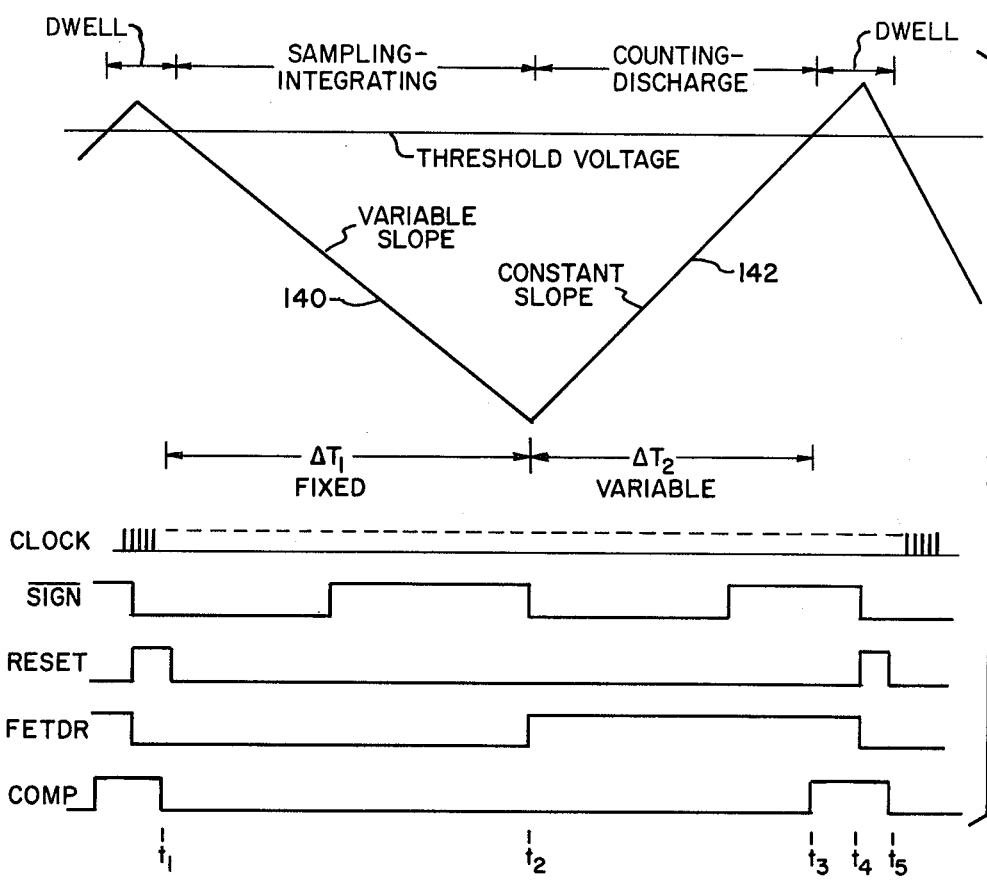
Figure 2B:
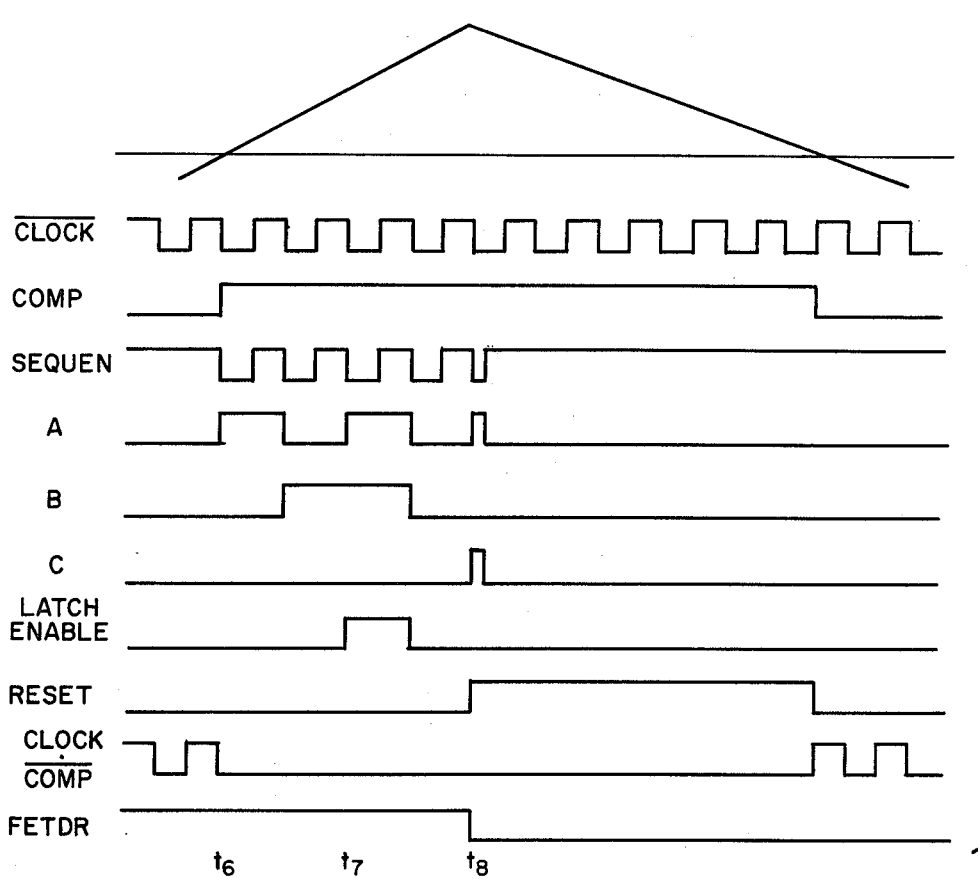

The above and other objects and features of the invention will become apparent from the following detailed description taken in connection with the accompanying drawings which form a part of this specification, and in which:

FIG. 1 is a block and schematic circuit diagram of the apparatus of the invention; and FIGS. 2A and 2B comprise waveforms illustrating the operation of the system of FIG. 1.

With reference now to the drawings, and particularly to FIG. 1, an analog signal produced by signal generator 10 is applied to a signal conditioning pre-amplifier enclosed by broken lines and identified generally by the reference number 12. The signal generator 10 may, for example, comprise a sensor, such as a thermocouple or pressure gauge, in an industrial process. The preamplifier 12 rejects common mode voltages with a balanced resistance-capacitive network followed by a high gain precision instrumentation operational amplifier 14. The signal is applied across capacitor 16 through resistors R1 and R2 with a pair of capacitors 18 and 20, the junction of these latter capacitors being grounded. Between the input terminals of amplifier 14 is a resistive network 22 connected at a point intermediate its ends to ground. The persistant common mode voltages, mostly of line frequency variety, are attenuated by the resistor network 22. Since the actual differential signal will also be reduced in size it must be amplified back to a workable voltage by the amplifier 14. The high common mode voltage spikes or impulses (e.g., 1000 volts, 1 microsecond) are filtered by the two capacitors 18 and 20 to ground so that they never reach dangerous levels. Suitable potentiometer means, not shown, is built into the amplifier 14 for eliminating any initial imbalance to voltages common to both input terminals. The normal mode noise component, due mainly to temperature drift of component parameters, is filtered by the capacitors 16, 18 and 20 and also by time averaging accomplished by the dual-slope method of analog-to-digital conversion, hereinafter described.

From the signal conditioning pre-amplifier 12, a single-ended output is applied to a dual-slope integrator, enclosed by broken lines and indicated by the reference number 24. It includes an operational amplifier 26 having a pair of inputs, one of which is connected to ground through resistor 28 as shown. Connected to the output of amplifier 26 is a resistor 30; and between the end of resistor 30 opposite the amplifier 26 and the other input to the amplifier 26 is the main integrating capacitor 32.

The other of the two inputs to the amplifier 26 is connected to a summing point 34. The summing point 34, in turn, is connected through transistor switch 36 and resistor 38 to a source of negative reference potential at 40. This same switch is connected to ground through diode 42. In a somewhat similar manner, the summing point 34 is connected through a second transistor switch 44 and resistors 46 and 48 to the output of operational amplifier 14 in pre-amplifier 12. Switch 44 is also connected to ground through back-to-back diodes 50 and 52. As will be seen, switch 44 is closed while switch 36 is open and vice versa. When switch 44 is closed, the capacitor 32 charges over a fixed period of time at a variable charging rate. Thereafter, when switch 44 opens and switch 36 closes, the capacitor discharges at a constant rate but over a variable time period, depending upon the slope of the charging ramp achieved when switch 44 is closed.

Of course, whether the capacitor 32 is said to charge when switch 44 is closed or when switch 36 is closed is a matter of semantics. In the specification and claims which follow, the capacitor 32 is said to charge or "integrate" from a threshold voltage over a fixed period of time at a variable charging rate and is said to "discharge" during a variable period of time at a fixed charging rate back to the threshold voltage when the switch 36 is closed and switch 44 is open.

The gate electrode of switch 36 is connected through diode 54 to the collector a first transistor 56; while the gate electrode of switch 44 is connected through diode 58 to the collector of a second transistor 60. The base of transistor 60 is connected to a flip-flop circuit 62, the purpose of which will hereinafter be explained. On the other hand, the base of transistor 56 is connected through diodes 64 to ground, and through resistor 66 to a source of positive potential. The potential source is also connected through resistor 68 to the emitters of transistors 56 and 60; while their collectors are connected through resistors 70 and 72 to a source of negative potential, substantially as shown. With the arrangement shown, transistor 56 will conduct in one of the two bistable states of the flip-flop 62 to close switch 36; while transistor 60 will conduct during the other of the two bistable states of the flip-flop to open switch 44 while switch 36 is closed.

The output of the integrator circuit 24, comprising the integrated voltage on capacitor 32 is applied to a comparator circuit, enclosed by broken lines and identified by the reference numeral 74. It comprises an operational amplifier 76 having a resistive feedback path 78 and two differential input terminals across which are connected capacitor 80 and back-to-back diodes 82 and 84. One of the inputs to amplifier 76 is connected to ground through resistor 86; while the other input is connected through resistor 88 to one end of integrating capacitor 32. When the integrated voltage across capacitor 32 is greater than a reference voltage (in this case ground), the output of amplifier 76 will be of one polarity; whereas when the integrated voltage is less than the reference voltage, the output of amplifier 76 will be of the opposite polarity.

The output of amplifier 76 is applied via lead 90 and inverter 92 to one input of NAND circuit 94. Additionally, it is applied to a latch circuit 96 and through inverter 98 to summing point 100 where the signal is collector "AND"-ed with clock pulses derived from a pulse generator or clock 102 and passing through inverters 104 and 106. If the signal on lead 90 at the output of comparator 74 is of one polarity, pulses from the clock 102 will pass through inverts 104 and 106 to a twelve-bit counter 108. However, when the output of inverter 74 on lead 90 reverses to the opposite polarity, the collector "AND"-ing of the signal from inverter 98 and pulses from inverter 106 at point 100 prevents pulses from being applied to the counter 108.

The clock pulses at the output of inverter 104 are also applied through lead 110 to the NAND circuit 94. As will hereinafter be seen, the latch circuit 96 produces an output which resets the twelve-bit counter 108. This reset signal on lead 112 is also applied to the flip-flop circuit 62 to cause it to change stable states. Additionally, it is applied to a sequencer circuit 114 and through inverter 116 to the NAND circuit 94. From the foregoing, it will be appreciated that the NAND circuit 94 will pass pulses on lead 110 from clock 102 to the sequencer circuit 114 only when the signal on lead 90 from the comparator 74 is of one polarity and a reset signal has not been produced by the latch 96.

The sequencer 114 is essentially a counter, the operation of which will hereinafter be described. At this time, however, it will be sufficient to state that when signals identified in FIG. 1 as C and A appear at the output of the sequencer 114, they will enable NAND circuit 118 to pass a pulse to the latch circuit 96 which will, in turn, reset the counter 108. The signals B and A are applied from the sequencer 114 to another NAND circuit 120, the output of which is applied through a buffer stage 122 to a twelve-bit latch or memory device 124 which can receive and store the count from counter 108, but only when it is enabled by a signal from the buffer 122. Assuming that the latch 124 is enabled to receive a count from counter 108, this count is applied through translator 126 to a computer 128 where signals are applied to the computer via diodes 130 as shown.

The channel shown in FIG. 1 is only one of many connected to the computer 128, the remaining channels being indicated generally by the reference numeral 132. When the computer requests information from the channel shown in FIG. 1, it will apply a signal via lead 134 to NAND circuit 121. Signals A and B are "AND"-ed by gate 120 during the dwell time (FIG. 2A) and permit the transfer of information from the counter to the twelve-bit latch digital memory device 124 only when the signal from line 134' to gate 120 is also true (logic 1). The signal from line 134' output of gate 121 is the signal which inhibits the transfer of information from the counter to the latches. The signal from gate 121 (inhibit) becomes false (logic 0) if the channel select signal (line 134) should become true (logic 1) before signals A and B both become true (logic 1). However, if A and B are both true before the channel select signal becomes true, the transfer of information will still be performed. Therefore, the transfer of information occurs during every dwell time period except when a channel select signal should be preceded in time by the encoding of signals A and B and remain ON during the encoding of A and B. Note, that the computer may channel select the circuit of FIG. 1 in an asynchronous manner (i.e., any time, not just during the dwell time).

The operation of the invention can perhaps best be understood from the waveforms of FIGS. 2A and 2B. The complete cycle of operation is shown in FIG. 2A; and it can be seen that each cycle consists of a sampling or integrating period, a counting or discharge period, and a dwell period during which information is transferred to a digital storage device which can subsequently pass this digital information through the interface to the computer upon channel select command by the computer.

It will be assumed that a cycle of operation begins at time $t_1$ in FIG. 2A, at which time the negative-going voltage on capacitor 32 crosses the threshold voltage level. Before time $t_1$, however, a reset pulse (identified as RESET in the waveforms of FIG. 2A) is produced at the output of latch circuit 96. This resets the counter 108, sequencer 114 and causes the flip-flop 62 to change stable states. At the same time, when the counter 108 is reset, a $\overline{SIGN}$ signal, comprising the most significant bit at the output of counter 108, drops in level. With flip-flop 62 changing states, switch 44 of FIG. 1 is now opened and switch 36 is closed. Consequently, capacitor 32 will integrate or charge along the slope 140 as shown in FIG. 2A for a fixed period of time, $\Delta T_1$, which is that time required for the counter 108 to count up to its maximum count. When the counter 108 has counted up to its maximum count at time $t_2$ shown in FIG. 2A, the $\overline{SIGN}$ signal is applied to the flip-flop 62 to cause it to switch stable states; whereupon switch 36 now closes and switch 44 opens. The result is that capacitor 32 now discharges along a constant slope 142 over a variable time period, $\Delta T_2$, depending upon the time required for the voltage on the capacitor to again reach the threshold voltage level as shown in FIG. 2A. When the voltage across capacitor 32 again reaches the threshold voltage at time $t_3$, this is sensed by the comparator circuit 74 which now produces a change of state in the COMP signal waveform of FIG. 2A at the output of inverter 92 to initiate the dwell period mentioned above. The state in the COMP waveform will persist between times $t_3$ and $t_5$; however it will be noted that between times $t_3$ and $t_5$, and specifically at time $t_4$, capacitor 32 begins to charge back toward the threshold voltage by virtue of the occurrence of the leading edge of a pulse in the RESET signal. Note that between times $t_3$ and $t_4$, the capacitor 32 is still discharging along slope 142 above the threshold voltage. During every dwell period, and assuming that the computer 128 is not ready to receive information from the channel, the 12-bit latch 124 will be enabled to receive the count of counter 108, derived during the period $\Delta T_2$. Furthermore, it will be noted that the count of the counter in the period $\Delta T_2$ is proportional to the voltage stored on the capacitor 32 during the sampling or integrating period between the time $t_1$, when the charge on the capacitor passes through the threshold voltage, and time $t_2$. Thus, the count which will be transferred to the computer is the digital equivalent of the analog signal as determined from the charge stored on capacitor 32 during a fixed charging period $\Delta T_1$.

The manner in which the RESET pulse of FIG. 2A is generated and the count of counter 108 transferred to memory device 124 is perhaps best illustrated by the waveforms of FIG. 2B which encompass the sequence of events occurring during the time that the waveform of FIG. 2A is above the threshold voltage or in the dwell period. At time $t_6$ corresponding to time $t_3$ of FIG. 2A, the voltage across capacitor 32 exceeds the threshold voltage, such that the COMP signal at the output of comparator 74 changes states. When this occurs, the NAND circuit 94 is enabled since the inverse of the RESET signal, ($\overline{RESET}$ waveform of FIG. 2B), as derived from inverter 116 is now of the correct state to enable the NAND circuit 94. As a result, $\overline{CLOCK}$ pulses from inverter 104 (FIG. 2B) pass through NAND circuit 94 to the sequencer 114 which, as mentioned above, is essentially a binary counter having output leads A, B and C connected to various states of the counter. The signals A, B and A.C are shown in FIG. 2B. Note that at time $t_7$, when waveforms A and B coincide, a latch enable pulse is produced, thereby enabling the latch 124 to receive the count from counter 108, assuming that a disabling signal is not applied to lead 134.

For purposes of the immediate description, let us assume that the latch enable pulse for latch 124 does occur at time $t_7$. Under these circumstances, the count stored in the latch 124 is transferred to the computer 128. Thereafter, at time $t_8$, the pulse in waveform A from sequencer 114 coincides with a pulse in waveform C. Consequently, NAND circuit 118 produces an output which triggers the latch circuit 96, along with the COMP signal at the output of inverter 92, to produce a RESET signal which resets counter 108, clears the flip-flop 62, and applies a disabling signal to the NAND circuit 94 whereby no further CLOCK pulses can be applied to the sequencer 114. As a result of the change of state of flip-flop 62, switch 44 again closes, switch 36 opens, and a new cycle of operation is initiated. At the same time, during the dwell period, and since the CLOCK pulses and the $\overline{COMP}$ signal are collector "AND"-ed at point 100, no CLOCK pulses are fed into the counter during the dwell period.

Should the computer 128 be requesting information from the channel of FIG. 1 during the dwell period, it will forward-bias two of the diodes 130 and enable the in-feed of information into the computer. At the same time, it produces a signal on lead 134 to disable NAND circuit 121. This prevents generation of the latch enable pulse via device 122 and prevents the 12-bit latch 124 from receiving information from counter 108.

Although the invention has been shown in connection with a certain specific embodiment, it will be readily apparent to those skilled in the art that various changes in form and arrangement of parts may be made to suit requirements without departing from the spirit and scope of the invention.

We claim as our invention:

1. In a single-point analog-to-digital subsystem interfaced with a digital computer and operative with successive conversion cycles from said single-point, a dual slope integrator operative with an analog input signal derived from said single-point, during each of said successive conversion cycles for storing a charge during a first mode characterized by a charging slope related to the magnitude of said analog input signal and for discharging the stored charge during a second mode characterized by a constant discharging slope, the combination of:

comparator means responsive to said integrator for continuously comparing a voltage representative of said stored charge to a threshold voltage and for detecting a voltage cross-over in either directions;

a counter operative during said second mode for generating a time-related count;

said comparator means being operative upon a first cross-over in one direction to initiate a fixed time interval during said first mode, said comparator means being operative upon a second cross-over in the opposite direction during said second mode to disable said counter, thereby to establish a final count in said counter relative to a current conversion cycle;

sequencer means actuated by said comparator means during a given conversion cycle in response to said second cross-over for establishing a first predetermined time interval after said second cross-over and for initiating said first mode for a subsequent conversion cycle at the end of said first predetermined time interval, said sequencer means also resetting said counter at the end of said first predetermined time interval;

latching means being provided operative with said counter for storing said final count;

said computer interrogating said subsystem from time-to-time to acquire said final count;

said sequencer means being further responsive to said second cross-over for establishing a second predetermined time interval therefrom, said second time interval being shorter than said first time interval;

means being provided responsive to said sequencer means for generating an enabling signal for transferring the count in said counter into said latching register means at the end of said second predetermined time interval; and, means for preventing the generation of said enabling signal when said sequencer means operates at the end of said second predetermined time interval in conjunction with an interrogation by said computer.

* * * * *